(12) United States Patent
Gu et al.

(10) Patent No.: US 10,891,913 B2
(45) Date of Patent: Jan. 12, 2021

(54) SHIFT REGISTER CIRCUITRY, GATE DRIVING CIRCUIT, AND DISPLAY DEVICE

(71) Applicants: BOE TECHNOLOGY GROUP CO., LTD., Beijing (CN); HEFEI BOE OPTOELECTRONICS TECHNOLOGY CO., LTD., Hefei (CN)

(72) Inventors: Honggang Gu, Beijing (CN); Junsheng Chen, Beijing (CN); Xianjie Shao, Beijing (CN); Jie Song, Beijing (CN); Lili Yao, Beijing (CN)

(73) Assignees: BOE TECHNOLOGY GROUP CO., LTD., Beijing (CN); HEFEI BOE OPTOELECTRONICS TECHNOLOGY CO., LTD., Hefei (CN)

( * ) Notice: Subject to any disclaimer, the term of this patent is extended or adjusted under 35 U.S.C. 154(b) by 332 days.

(21) Appl. No.: 15/773,013

(22) PCT Filed: Nov. 17, 2017

(86) PCT No.: PCT/CN2017/111559
§ 371 (c)(1),
(2) Date: May 2, 2018

(87) PCT Pub. No.: WO2018/218886
PCT Pub. Date: Jun. 12, 2018

(65) Prior Publication Data
US 2020/0243034 A1    Jul. 30, 2020

(30) Foreign Application Priority Data

May 27, 2017 (CN) .......................... 2017 1 0390668

(51) Int. Cl.
G09G 3/36 (2006.01)
G11C 19/28 (2006.01)

(52) U.S. Cl.
CPC ......... *G09G 3/3677* (2013.01); *G09G 3/3696* (2013.01); *G11C 19/28* (2013.01);
(Continued)

(58) Field of Classification Search
CPC .......................................... G09G 3/3674–3677
See application file for complete search history.

(56) References Cited

U.S. PATENT DOCUMENTS

2015/0077319 A1* 3/2015 Yao .......................... G09G 3/20
345/100
2015/0235590 A1* 8/2015 Peng .................... G09G 3/3674
327/109

FOREIGN PATENT DOCUMENTS

CN  102842278 A  12/2012
CN  102956269 A  3/2013
(Continued)

OTHER PUBLICATIONS

International Search Report and Written Opinion for PCT/CN2017/111559, dated Feb. 26, 2018.

*Primary Examiner* — Hang Lin
(74) *Attorney, Agent, or Firm* — Dinsmore & Shohl LLP

(57) ABSTRACT

The present disclosure provides a shift register circuitry, a gate driving circuit, and a display device. The shift register circuitry of the present disclosure includes a first shift register unit, a second shift register unit, a pull-down control sub-circuit (20), and a pull-down sub-circuit (30); wherein the first shift register unit includes a first input Sub-circuit (11), a first output sub-circuit (12), a first reset sub-circuit, and a first noise reduction sub-circuit (14); a second shift register unit includes a second input sub-circuit (21), a
(Continued)

second output sub-circuit (22), a second reset sub-circuit and a second noise reduction sub-circuit (24).

19 Claims, 5 Drawing Sheets

(52) U.S. Cl.
CPC .............. *G09G 2300/0842* (2013.01); *G09G 2310/0286* (2013.01)

(56) References Cited

FOREIGN PATENT DOCUMENTS

| | | | |
|---|---|---|---|
| CN | 103208311 A | | 7/2013 |
| CN | 104376825 A | | 2/2015 |
| CN | 106157912 A | * | 11/2016 |
| CN | 106157912 A | | 11/2016 |
| GB | 2360650 B | | 3/2002 |

* cited by examiner ns SHIFT REGISTER CIRCUITRY, GATE
DRIVING CIRCUIT, AND DISPLAY DEVICE

CROSS-REFERENCE TO RELATED
APPLICATIONS

This application is a U.S. National Stage under 35 U.S.C. § 371 of International Application No. PCT/CN2017/111559, filed on Nov. 17, 2017, which claims priority to Chinese Patent Application No. 201710390668.5, filed on May 27, 2017. The disclosure of each application is incorporated hereby by reference in entirety.

TECHNICAL FIELD

The present disclosure relates to a shift register circuitry, a gate driving circuit, and a display device.

BACKGROUND

With continuous development of liquid crystal display, high resolution and narrow frames have become a development trend of liquid crystal display. Application of gate shift registers in a panel is one of approaches to achieve a narrow frame and high resolution.

The Gate Driver on Array (GOA) design of a gate driver can lower cost of a liquid crystal display panel while reducing a process to increase production. With development of flat panel displays, high resolution and narrow frames have become a development trend. To realize a high resolution and narrow frame display, one solution is to integrate gate driving circuits on the panel.

SUMMARY

The present disclosure provides a shift register circuitry including: a first shift register unit, a second shift register unit, a pull-down control sub-circuit, and a pull-down sub-circuit. The first shift register unit comprises: a first input sub-circuit, a first output sub-circuit, a first reset sub-circuit, and a first noise reduction sub-circuit. The second shift register unit includes: a second input sub-circuit, a second output sub-circuit, a second reset sub-circuit, and a second noise reduction sub-circuit. The first input sub-circuit is configured to pre-charge a first pull-up node under control of a first input signal. The first pull-up node is a connection node between a first input sub-circuit, a first output sub-circuit, a pull-down sub-circuit, the first reset sub-circuit, and the first noise reduction sub-circuit. The first output sub-circuit is configured to output a first clock signal through a first signal output terminal under control of a potential of the first pull-up node. The first reset sub-circuit is configured to reset potentials of the first pull-up node and the first signal output terminal through the first voltage signal under control of a first reset signal. The second input sub-circuit is configured to pre-charge a second pull-up node under control of a second input signal; the second pull-up node is a connection node between the second input sub-circuit, the second output sub-circuit and the pull-down sub-circuit. The second output sub-circuit is configured to output a second clock signal through a second signal output terminal under control of a potential of the second pull-up node. The second reset sub-circuit is configured to reset potentials of the second pull-up node and the second signal output terminal through the first voltage signal under control of a second reset signal. The pull-down control sub-circuit is configured to control a potential of a pull-down node under control of the first clock signal or the second clock signal; the pull-down node is a connection node between the pull-down control sub-circuit, the pull-down sub-circuit, the first noise reduction sub-circuit and the second noise reduction sub-circuit. The pull-down sub-circuit is configured to pull down a potential of the pull-down node through the first voltage signal under control of a potential of the first pull-up node and a potential of the second pull-up node. The first noise reduction sub-circuit is configured to reduce output noise of the first pull-up node and the first signal output terminal through the first voltage signal under control of the pull-down node. The second noise reduction sub-circuit is configured to reduce output noise of the second pull-up node and the second signal output terminal through the first voltage signal under control of the pull-down node.

In some embodiments, the shift register circuitry further includes a storage sub-circuit for maintaining the potential of the pull-down node.

In some embodiments, the first input sub-circuit includes a first transistor.

A first electrode and a control electrode of the first transistor are both connected to a first input signal terminal, and a second electrode of the first transistor is connected to the first pull-up node.

In some embodiments, the first output sub-circuit includes a third transistor and a first storage capacitor.

A first electrode of the third transistor is connected to a first clock signal terminal, a second electrode of the third transistor is connected to a first signal output terminal, and a control electrode of the third transistor is connected to the first pull-up node.

A first end of the first storage capacitor is connected to the first pull-up node, and a second end of the first storage capacitor is connected to the first signal output terminal.

In some embodiments, the first reset sub-circuit comprises: a second transistor and a thirteenth transistor.

A first electrode of the second transistor is connected to the first pull-up node, a second electrode of the second transistor is connected to a first voltage signal terminal, and a control electrode of the second transistor is connected to a first reset signal terminal.

A first electrode of the thirteenth transistor is connected to the first signal output terminal, a second electrode of the thirteenth transistor is connected to the first voltage signal terminal, and a control electrode of the thirteenth transistor is connected to a second clock signal terminal.

In some embodiments, the first reset sub-circuit comprises: a second transistor and a thirteenth transistor.

A first electrode of the second transistor is connected to the first pull-up node, a second electrode of the second transistor is connected to a first voltage signal terminal, and a control electrode is connected to a first reset signal terminal.

A first electrode of the thirteenth transistor is connected to the first signal output terminal, a second electrode of the thirteenth transistor is connected to a first voltage signal terminal, and a control electrode of the thirteenth transistor is connected to a first reset signal terminal.

In some embodiments, the first noise reduction sub-circuit comprises a fourth transistor and a fifteenth transistor.

A first electrode of the fourth transistor is connected to the first signal output terminal, a second electrode of the fourth transistor is connected to a first voltage signal terminal, and a control electrode of the fourth transistor is connected to the pull-down node.

A first electrode of the fifteenth transistor is connected to the first pull-up node, a second electrode of the fifteenth transistor is connected to a first voltage signal terminal, and a control electrode of the fifteenth transistor is connected to the pull-down node.

In some embodiments, the second input sub-circuit comprises a fifth transistor.

A first electrode and a control electrode of the fifth transistor are both connected to a second input signal terminal, and a second electrode of the fifth transistor is connected to the second pull-up node.

In some embodiments, the second output sub-circuit includes a seventh transistor and a second storage capacitor.

A first electrode of the seventh transistor is connected to a second clock signal terminal, a second electrode of the seventh transistor is connected to the second signal output terminal, and a control electrode of the seventh transistor is connected to the second pull-up node.

A first end of the second storage capacitor is connected to the second pull-up node, and a second end of the second storage capacitor is connected to the second signal output terminal.

In some embodiments, the second reset sub-circuit comprises a sixth transistor and a fourteenth transistor.

A first electrode of the sixth transistor is connected to the second pull-up node, a second electrode of the sixth transistor is connected to a first voltage signal terminal, and a control electrode of the sixth transistor is connected to a second reset signal terminal. A first electrode of the fourteenth transistor is connected to the second signal output terminal, a second electrode of the fourteenth transistor is connected to the first voltage signal terminal, and a control electrode of the fourteenth transistor is connected to the first clock signal terminal.

In some embodiments, the second reset sub-circuit comprises a sixth transistor and a fourteenth transistor.

A first electrode of the sixth transistor is connected to the second pull-up node, a second electrode of the sixth transistor is connected to a first voltage signal terminal, and a control electrode of the sixth transistor is connected to a second reset signal terminal.

A first electrode of the fourteenth transistor is connected to the second signal output terminal, a second electrode of the fourteenth transistor is connected to the first voltage signal terminal, and a control electrode of the fourteenth transistor is connected to a second reset signal terminal.

In some embodiments, the second noise reduction sub-circuit comprises an eighth transistor and a sixteenth transistor.

A first electrode of the eighth transistor is connected to the second signal output terminal, a second electrode of the eighth transistor is connected to a first voltage signal terminal, and a control electrode of the eighth transistor is connected to the pull-down node.

A first electrode of the sixteenth transistor is connected to the second pull-up node, a second electrode of the sixteenth transistor is connected to a first voltage signal terminal, and a control electrode of the sixteenth transistor is connected to the pull-down node.

In some embodiments, the pull-down sub-circuit comprises a ninth transistor, a tenth transistor, and a twelfth transistor.

A first electrode and a control electrode of the ninth transistor are both connected to the first pull-up node, and a second electrode of the ninth transistor is connected to a control electrode of the twelfth transistor. A first electrode and a control electrode of the tenth transistor are both connected to the second pull-up node, and a second electrode of the tenth transistor is connected to the control electrode of the twelfth transistor. A first electrode of the twelfth transistor is connected to the pull-down node, a second electrode of the twelfth transistor is connected to a first voltage signal terminal, and the control electrode of the twelfth transistor is connected to the second electrode of the first transistor and the second electrode of the tenth transistor.

In some embodiments, the pull-down control sub-circuit comprises an eleventh transistor.

A first electrode and a control electrode of the eleventh transistor are both connected to a second clock signal terminal, and a second electrode of the eleventh transistor is connected to the pull-down node.

In some embodiments, the pull-down control sub-circuit comprises an eleventh transistor.

A first electrode and a control electrode of the eleventh transistor are both connected to a first clock signal terminal, and a second electrode of the eleventh transistor is connected to the pull-down node.

In some embodiments, the storage sub-circuit includes a third storage capacitor.

A first end of the third storage capacitor is connected to the pull-down node, and a second end of the third storage capacitor is connected to the first voltage signal terminal.

The present disclosure provides a gate driving circuit including shift register circuitries as above-mentioned.

In some embodiments, a first input signal terminal of a first shift register unit of a shift register circuitry at each stage is connected to a second signal output terminal of a second shift register unit of a shift register circuitry at a previous stage.

A first reset signal terminal of the first shift register unit of the shift register circuitry at each stage is connected to a second signal output terminal of a second shift register unit of the shift register circuitry at current stage.

A first signal output terminal of the first shift register unit of the shift register circuitry at each stage is connected to a second signal input terminal of the second shift register unit of the shift register circuitry at current stage.

A second signal output terminal of the second shift register unit of the shift register circuitry at each stage is connected to a first signal input terminal of a first shift register unit of a shift register circuitry at a next stage.

A second reset signal terminal of the second shift register unit of the shift register circuitry at each stage is connected to a first signal output terminal of a first shift register unit of the shift register circuitry at the next stage.

The present disclosure provides a display device including the above-described gate driving circuit.

DETAILED DESCRIPTION

Figure 1:
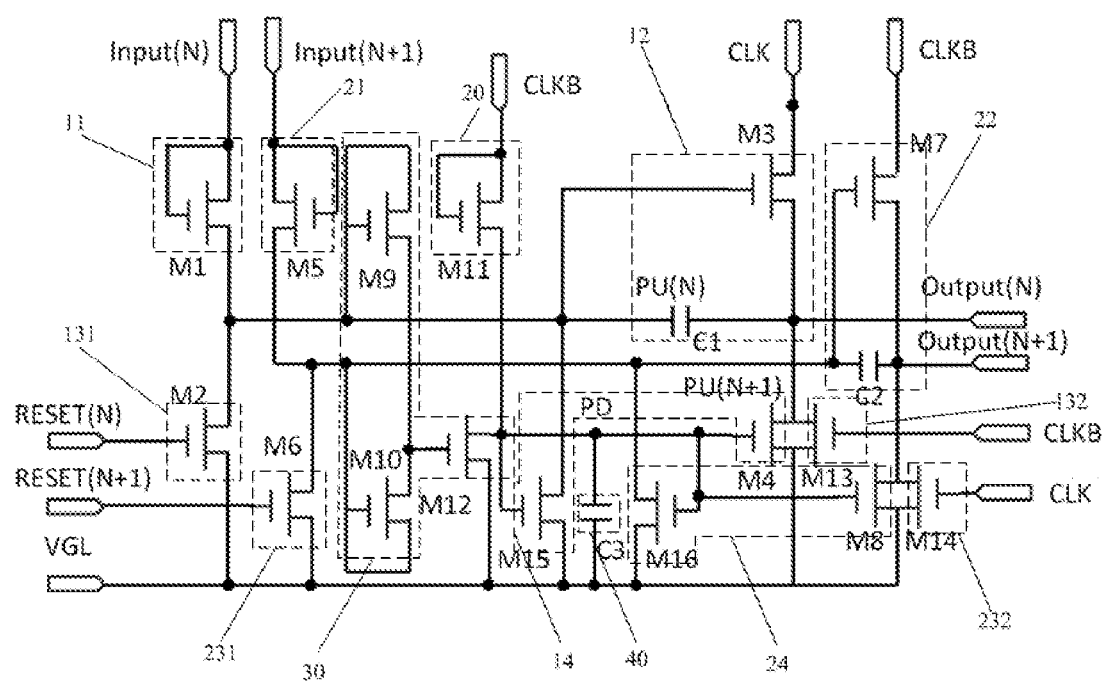
FIGS. 1-3 are schematic diagrams of shift registers according to embodiments of the present disclosure.

To enable those skilled in the art to better understand the technical solutions of the present disclosure, the present disclosure will be further described in detail below in conjunction with the accompanying drawings and specific implementations.

Transistors used in embodiments of the present disclosure may be thin film transistors, field effect transistors, or similar devices with other characteristics. Since sources and drains of the used transistors are interchangeable under certain conditions, there is no difference between the sources and the drains in view of description of connection relationship. In embodiments of the present disclosure, in order to distinguish between a source and a drain of a transistor, one of them is referred to as a first electrode, the other is referred to as a second electrode, and a gate is referred to as a control electrode. In addition, a transistor can be classified into an N-type transistor or a P-type transistor according to characteristics of the transistor. The following embodiments are described by taking N-type transistors as the transistors. In case that an N-type transistor is used, the first electrode is the drain of the N-type transistor, and the second electrode is the source of the N-type transistor, wherein when a high level is input to the gate, the source and the drain are turned on; for a P-type transistor, the situation is opposite. It can be conceived that implementations by using P-type transistors as the transistors can be easily conceived by those skilled in the art without paying any creative effort, and thus are also within a protection scope of the embodiments of the present disclosure.

In the embodiments of the present disclosure, the explanation is made by taking a thin film transistor which is an N-type transistor as an example. Therefore, in the following description, the first voltage signal is a low-level signal, and the first voltage signal terminal is a low-level signal terminal. It should be understood that if the thin film transistor is a P-type transistor, then the first voltage signal is a high level signal, and the first voltage signal terminal is a high-level signal terminal.

The present disclosure aims to solve or alleviate at least one of the technical problems existing in the prior art, and provides a shift register, a gate driving circuit, and a display device with low power consumption and a simple structure.

The present disclosure has the following beneficial effects:

A shift register in the present disclosure includes two shift register units, namely a first shift register unit and a second shift register unit, providing signals for different rows of gate lines. The two shift register units share a pull-down sub-circuit and a pull-down control sub-circuit, that is, the first shift register unit and the second shift register unit are connected to a same pull-down node. A storage sub-circuit is added at the same time, then the potential of the pull-down node can be maintained, thereby achieving that after both of the two shift register units have been reset, the pull-down node continuously discharges the pull-up node and the two signal output terminals, which solves a noise voltage problem caused by clock signals, and improves a yield rate. At the same time, the two shift register units share a pull-down node, which reduces a number of transistors as compared to existing shift registers, thereby effectively reducing power consumption.

Figure 2:
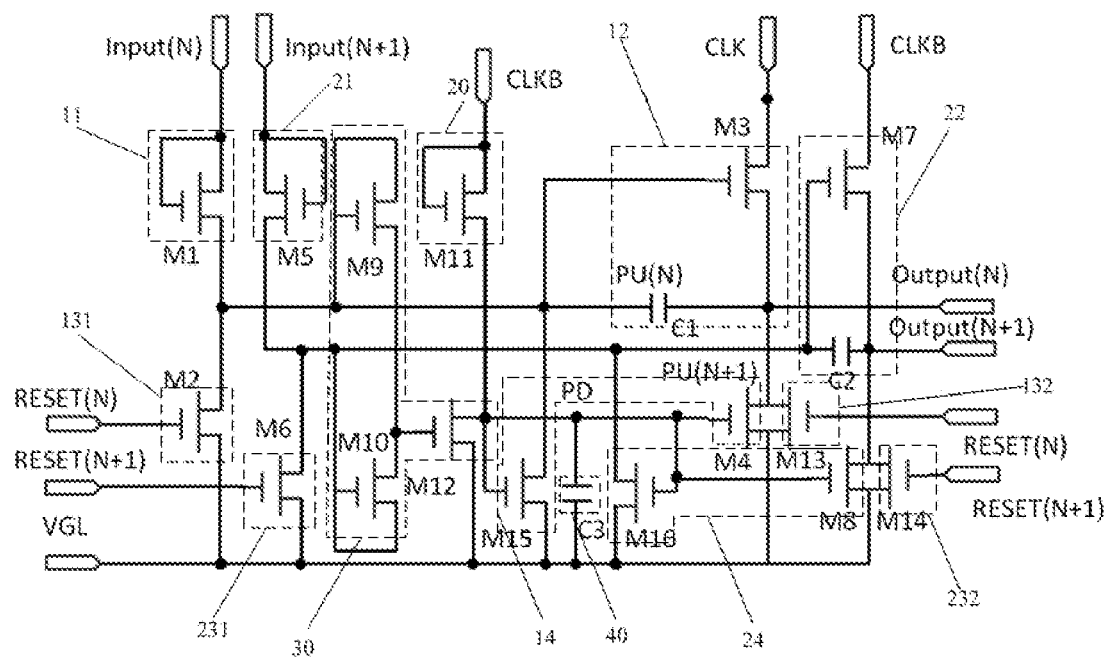
Figure 3:
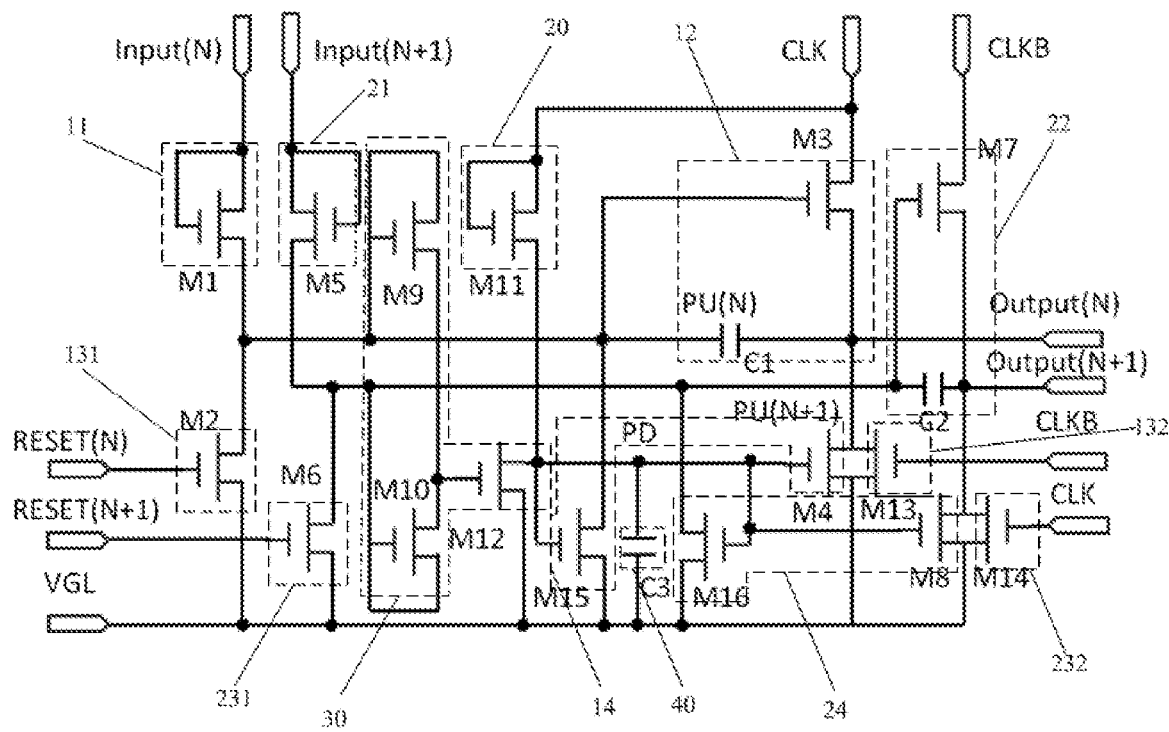

Referring to FIG. 1 to FIG. 3, in some embodiments of the present disclosure, a shift register is provided. The shift register includes a first shift register unit, a second shift register unit, a pull-down control sub-circuit 20 and a pull-down sub-circuit 30. The first shift register unit comprises: a first input sub-circuit 11, a first output sub-circuit 12, a first reset sub-circuit, and a first noise reduction sub-circuit 14. The second shift register unit comprises: a second input sub-circuit 21, a second output sub-circuit 22, a second reset sub-circuit, and a second noise reduction sub-circuit 24.

For example, the first input sub-circuit 11 is configured to pre-charge a first pull-up node PU(N) under control of a first input signal. The first pull-up node PU(N) is a connection node between the first input sub-circuit 11, the first output sub-circuit 12, the pull-down sub-circuit 30, the first reset sub-circuit and the first noise reduction sub-circuit 14. The first output sub-circuit 12 is configured to output a first clock signal through a first signal output terminal Output(N) under control of a potential of the first pull-up node PU(N). The first reset sub-circuit is configured to reset potentials of the first pull-up node PU(N) and the first signal output terminal Output(N) through a low-level signal under control of a first reset signal. The second input sub-circuit 21 is configured to pre-charge a second pull-up node PU(N+1) under control of a second input signal. The second pull-up node PU(N+1) is a connection node between the second input sub-circuit 21, the second output sub-circuit 22, and the pull-down sub-circuit 30. The second output sub-circuit 22 is configured to output a second clock signal through a second signal output terminal Output(N+1) under control of a potential of the second pull pull node PU(N+1). The second reset sub-circuit is configured to reset potentials of the second pull-up node PU(N+1) and the second signal output terminal Output(N+1) through a low-level signal under control of a second reset signal. The pull-down control circuit 20 is configured to control a potential of a pull-down node PD under control of the first clock signal or the second clock signal. The pull-down sub-circuit 30 is configured to pull down the potential of the pull-down node PD by the low-level signal under control of the potential of the first pull-up node PU(N) and the potential of the second pull-up node PU(N+1). The pull-down node PD is a connection node between the pull-down sub-circuit 30, the pull-down control sub-circuit 20, a first noise reduction sub-circuit 14 and a second noise reduction sub-circuit 24. The first noise reduction sub-circuit 14 is configured to reduce output noise of the first pull-up node PU(N) and the first signal output terminal Output(N) by the low-level signal under control of the pull-down node PD. The second noise reduction sub-circuit 24 is configured to reduce output noise of the second pull-up node PU(N+1) and the second signal output terminal Output(N+1) through the low-level signal under control of the pull-down node PD.

Since the shift register in some embodiments of the present disclosure includes two shift register units, namely a first shift register unit and a second shift register unit, which provide signals for different rows of gate lines. The two shift register units share a pull-down sub-circuit 30 and a pull-down control sub-circuit 20, that is to say, the first shift register unit and the second shift register unit are connected to the same pull-down node PD, thereby sharing one pull-down node PD. Hence, as compared to existing shift registers, the number of transistors is reduced, thereby effectively reducing power consumption. A storage sub-circuit 40 may be additionally added to maintain the potential of the pull-down node, so that after both of the two shift register units have been reset, the pull-down node PD continuously discharges for the pull-up nodes and the two signal output terminals, which solves a noise voltage problem caused by clock signals and improves a yield rate.

Referring to FIG. 1 to FIG. 3, in some embodiments of the present disclosure, a shift register is provided. The shift register includes a first shift register unit, a second shift register unit, a pull-down control sub-circuit 20, and a pull-down sub-circuit 30, and one or more storage capacitor.

The first shift register unit comprises a first input sub-circuit 11, a first output sub-circuit 12, a first reset sub-circuit and a first noise reduction sub-circuit 14. The second shift register unit comprises the second input sub-circuit 21, the second output sub-circuit 22, the second reset sub-circuit and the second noise reduction sub-circuit 24.

A specific description of a structure of the first shift register unit is as follows:

The first input sub-circuit 11 is connected to the first input signal terminal Input(N) and the first pull-up node PU(N), and is configured to pre-charge the first pull-up node PU(N) by the first input signal input through the first input signal terminal Input(N).

For example, the first input sub-circuit 11 may include a first transistor M1; wherein the first electrode and the control electrode of the first transistor M1 are both connected to the first input signal terminal Input(N), and the second electrode of the first transistor M1 is connected to the first pull-up node PU(N).

In a pre-charging stage of the first shift register unit, when the first input signal input by the first input signal input terminal Input(N) is at a high level, the first transistor M1 is turned on. At this time, the high level signal can pass through the first transistor M1 to pre-charge the first pull-up node PU(N).

The first output sub-circuit 12 is connected to the first clock signal terminal CLK, the first pull-up node PU(N), and the first signal output terminal Output(N), and is configured to output the first clock signal input by the first clock signal terminal CLK through the first signal output terminal Output(N) under control of the potential of the first pull-up node PU(N).

For example, the first output sub-circuit 12 may include a third transistor M3 and a first storage capacitor C1. The first electrode of the third transistor M3 is connected to the first clock signal terminal CLK, the second electrode of the third transistor M3 is connected to the first signal output terminal Output(N), and the control electrode of the third transistor M3 is connected to the first pull-up node PU(N). A first end of the first storage capacitor C1 is connected to the first pull-up node PU(N), and a second end of the first storage capacitor C1 is connected to the first signal output terminal Output(N).

During an output stage of the first shift register unit, since the first pull-up node PU(N) is pulled up to the high level during the pre-charge stage, the third transistor M3 is turned on at this time; the first clock signal input by the first clock signal terminal CLK is a high level signal, so the first signal output terminal Output(N) outputs a high level signal; at the same time, the potential of the first pull-up node PU(N) further rises due to a bootstrap effect of the first storage capacitor C1.

A first pull-up node reset unit 131 in the first reset sub-circuit is connected to a first reset signal terminal RESET(N), the first pull-up node PU(N) and a low-level signal terminal VGL to pull down the potential of the first pull-up node by a low-level signal input by the low-level signal terminal VGL under control of the first reset signal input by a reset signal terminal RESET(N), so as to complete resetting of the first pull-up node PU(N). A first signal output terminal Output(N) reset unit 132 in the first reset sub-circuit is connected to a second clock signal terminal CLKB, the first signal output terminal Output(N), and the low-level signal terminal VGL to pull down the potential of the first signal output terminal Output(N) through the low level signal input by the low level signal terminal VGL under control of a second clock signal input by the second clock signal terminal CLKB, so as to complete resetting of the first signal output Output(N).

For example, the first pull-up node PU(N) reset unit 131 may include a second transistor M2. The first electrode of the second transistor M2 is connected to the first pull-up node PU(N), and the second electrode of the second transistor M2 is connected to the low-level signal terminal VGL, and the control electrode of the second transistor M2 is connected to the first reset signal terminal RESET(N). The first signal output terminal Output(N) reset unit 132 may include a thirteenth transistor M13. The first electrode of the thirteenth transistor M13 is connected to the first signal output terminal Output(N), the second electrode of the thirteenth transistor M13 is connected to the low-level signal terminal VGL, and the control electrode of the thirteenth transistor M13 is connected to the second clock signal terminal CLKB.

During a reset stage of the first shift register unit, the first reset signal input by the first reset signal terminal RESET(N) is a high level signal, the second transistor M2 is turned on, and the low level signal input by the low level signal terminal VGL pulls down the potential of the first pull-up node PU(N) to complete resetting of the first pull-up node PU(N). Meanwhile, the second clock signal input by the second clock signal terminal CLKB is a high level signal, the thirteenth transistor M13 is turned on, and the low-level signal input by the low-level signal terminal VGL pulls down the potential of the first signal output terminal Output (N) to complete resetting of the first signal output terminal Output(N).

Of course, the first signal output terminal Output(N) reset unit 132 in the first reset sub-circuit may not be connected to the second clock signal terminal CLKB, but may be connected to the first reset signal terminal RESET(N), the first signal output terminal Output(N) and the low level signal terminal VGL, as shown in FIG. 2. At this time, the first electrode of the thirteenth transistor M13 included in the first signal output terminal Output(N) reset unit 132 is connected to the first signal output terminal Output(N), and the second electrode of the thirteenth transistor M13 is connected to the low level signal terminal VGL, the control electrode of the thirteenth transistor M13 is connected to the first reset signal terminal RESET(N). During the reset stage of the first shift register unit, the first reset signal input by the first reset signal terminal RESET(N) is a high level signal, and the second transistor M2 and the thirteenth transistor M13 are both turned on, and the low level signal input by the low level signal terminal VGL pulls down potentials of the first pull-up node PU(N) and the first signal output terminal Output(N) to complete resetting of the first pull-up node PU(N) and the first signal output terminal Output(N).

The first noise reduction sub-circuit 14 is connected to the first pull-up node PU(N), the first signal output terminal Output(N), the pull-down node PD and the low-level signal terminal VGL, and is configured to reduce output noise of the first pull-up node PU(N) and the first signal output terminal Output(N) by the low-level signal input by the low-level signal terminal VGL under control of the potential of the node PD.

For example, the first noise reduction sub-circuit 14 includes a fourth transistor M4 and a fifteenth transistor M15. The first electrode of the fourth transistor M4 is connected to the first signal output terminal Output(N), the second electrode of the fourth transistor M4 is connected to the low-level signal terminal VGL, and the control electrode of the fourth transistor M4 is connected to the pull-down node PD. The first electrode of the fifteenth transistor M15 is connected to the first pull-up node PU(N), and the second electrode of the fifteenth transistor M15 is connected to the low-level signal terminal VGL, and the control electrode of the fifteenth transistor M15 is connected to the pull-down node PD.

During a noise reduction stage of the first shift register unit, the pull-down node PD is pulled up to the high level and the storage sub-circuit 40 is charged at the same time. At this time, the fifteenth transistor M15 is turned on to reduce output noise of the first pull-up node PU (N). The fourth transistor M4 is turned on to reduce noise of the first signal output terminal Output(N).

The specific description of a structure of the second shift register unit is as follows:

The second input sub-circuit 21 is connected to a second input signal terminal Input(N+1) and a second pull-up node PU(N+1), and is configured to pre-charge the second pull-up node PU(N+1) by a second input signal input by the second input signal terminal Input(N+1).

For example, the second input sub-circuit 21 may include a fifth transistor M5. The first electrode and the control electrode of the fifth transistor M5 are both connected to the second input signal terminal Input(N+1), and the second electrode of the fifth transistor M5 is connected to the second pull-up node PU(N+1).

During the pre-charge stage of the second shift register unit, the second input signal terminal Input(N+1) is input with a high level signal, and the second pull-up node PU(N+1) is pre-charged with the high level signal.

The second output sub-circuit 22 is connected to the second clock signal terminal CLKB, the second pull-up node PU(N+1), and the second signal output terminal Output (N+1), and is configured to control the second clock signal input by the second clock signal terminal CLKB to be output through the second signal output terminal Output(N+1) under control of the potential of the second pull-up node PU(N+1).

For example, the second output sub-circuit 22 may include a seventh transistor M7 and a second storage capacitor C2. The first electrode of the seventh transistor M7 is connected to the second clock signal terminal CLKB, the second electrode of the seventh transistor M7 is connected to a second signal output terminal Output(N+1), and the control electrode of the seventh transistor M7 is connected to the second pull-up node PU(N+1). A first end of the second storage capacitor C2 is connected to the second pull-up node PU(N+1), and a second end of the second storage capacitor C2 is connected to the second signal output terminal Output(N+1).

During the output stage of the second shift register unit, since the second pull-up node PU(N+1) is pulled up to a high level in the pre-charge stage, the fifth transistor M5 is turned on at this time; the second clock signal input by the second clock signal terminal CLKB is a high level signal, so the second signal output terminal Output(N+1) outputs a high level signal; meanwhile, due to the bootstrap effect of the second storage capacitor C2, the potential of the second pull-up node PU(N+1) further rises.

A second pull-up node reset unit 231 in the second reset sub-circuit is connected to a second reset signal terminal RESET(N+1), the second pull-up node PU(N+1) and the low-level signal terminal VGL, and is configured to pull down the potential of the second pull-up node PU(N+1) by the low level signal input by the low level signal terminal VGL under control of the second reset signal input by the second reset signal terminal RESET(N+1), so as to complete resetting of the second pull-up node PU(N+1). A second signal output terminal output (N+1) reset unit 232 in the second reset sub-circuit is connected to the first clock signal terminal CLK, the low-level signal terminal VGL and the second signal output terminal Output(N+1), and is configured to pull down the potential of the second signal output terminal Output(N+1) by the low-level signal input by the low-level signal terminal VGL under control of the first clock signal input by the first clock signal terminal CLK, so as to complete resetting of the second signal output terminal Output(N+1).

For example, the second pull-up node PU(N+1) reset unit 231 may include a sixth transistor M6. The second signal output terminal Output(N+1) reset unit 232 may include a fourteenth transistor M14. The first electrode of the sixth transistor M6 is connected to the second pull-up node PU(N+1), the second electrode of the sixth transistor M6 is connected to the low-level signal terminal VGL, and the control electrode of the sixth transistor M6 is connected to the second reset signal terminal RESET(N+1). The first electrode of the fourteenth transistor M14 is connected to the second signal output terminal Output(N+1), the second electrode of the fourteenth transistor M14 is connected to the low-level signal terminal VGL, and the control electrode of the fourteen transistor M14 is connected to the first clock signal terminal CLK.

During the reset stage of the second shift register unit, the reset signal input by the second reset signal terminal RESET (N+1) is a high level signal, the sixth transistor M6 is turned on, and the second pull-up node PU(N+1) is pulled down to a low level, i.e., the reset of the second pull-up node PU(N+1) is completed. The signal written by the first clock signal terminal CLK is also a high-level signal, and the fourteenth transistor M14 is turned on. The second signal output terminal Output(N+1) is pulled down to a low level, that is, the reset of the second signal output terminal Output(N+1) is completed.

Of course, the second signal output terminal Output(N+1) reset unit 232 in the second reset sub-circuit may also be not connected to the first clock signal terminal CLK, but may be connected to the second reset signal terminal RESET(N+1), the second signal output terminal Output(N+1) and the low level signal terminal VGL, as shown in FIG. 2. At this time, the first electrode of the fourteenth transistor M14 included in the second signal output terminal Output(N+1) reset unit 232 is connected to the second signal output terminal Output(N+1), the second electrode of the fourteenth transistor M14 is connected to the low-level signal terminal VGL, and the control electrode of the fourteenth transistor M14 is connected to the second reset signal terminal RESET (N+1). During the reset stage of the second shift register unit, the second reset signal input by the second reset signal terminal RESET(N+1) is a high level signal, and the sixth transistor M6 and the fourteenth transistor M14 are both turned on, the potentials of the second pull-up node PU(N+1) and the second signal output terminal Output(N+1) are pulled down by the low-level signal input by the level signal terminal VGL, so as to complete resetting of the second pull-up node PU(N+1) and the second signal output Output (N+1).

The second noise reduction sub-circuit 24 is connected to the second pull-up node PU(N+1), the second signal output terminal Output(N+1), the pull-down node PD, and the low-level signal terminal VGL, and is configured to reduce output noise of the second pull-up node PU(N+1) and the second signal output terminal Output(N+1) by the low-level signal input by the low-level signal terminal VGL under control of the potential of the pull-down node PD.

For example, the second noise reduction sub-circuit 24 includes an eighth transistor M8 and a sixteenth transistor M16. The first electrode of the eighth transistor M8 is connected to the second signal output terminal Output(N+1), the second electrode of the eighth transistor M8 is connected to the low-level signal terminal VGL, and the control electrode of the eighth transistor M8 is connected to the pull-down node PD. The first electrode of the sixteenth transistor M16 is connected to the second pull-up node PU(N+1), and the second electrode of the sixteenth transistor M16 is connected to the low-level signal terminal VGL, and the control electrode of the sixteenth transistor M16 is connected to the pull-down node PD.

During the noise reduction stage of the second shift register unit, the pull-down node PD is pulled up to the high level and the storage sub-circuit 40 is charged at the same time. At this time, the sixteenth transistor M16 is turned on to reduce output noise of the second pull-up node PU(N+1). The eighth transistor M8 is turned on to reduce noise of the second signal output terminal Output(N+1).

The above is an introduction to the first shift register unit and the second shift register unit in the shift register in some embodiments of the present disclosure; next, specific structures of the storage sub-circuit 40, the pull-down sub-circuit 30 and the pull-down control sub-circuit 20 in some embodiments of the present disclosure are described.

In some embodiments of the present disclosure, the storage sub-circuit 40 in the shift register includes a third storage capacitor C3. A first end of the third storage capacitor C3 is connected to the pull-down node PD, and a second end of the third storage capacitor C3 is connected to the low-level signal terminal VGL. The third storage capacitor C3 is used to maintain the potential of the pull-down node PD.

The pull-down control sub-circuit 20 is connected to the second clock signal input terminal and the pull-down node PD, and is configured to charge the pull-down node PD under control of the second clock signal input by the second clock signal input terminal, that is, to charge the storage capacitor C3 so that the third storage capacitor C3 maintains the pull-down node PD at a high potential after the first shift register unit and the second shift register unit are reset, so that the first noise reduction sub-circuit 14 and the second noise reduction sub-circuit 24 can continuously reduce noises of signals output by the first pull-up node PU(N), the second pull-up node PU(N+1), the first signal output terminal Output(N), and the second signal output terminal Output (N+1).

For example, the pull-down control sub-circuit 20 may include an eleventh transistor M11. The first electrode and the control electrode of the eleventh transistor M11 are both connected to the first clock signal terminal, and the second electrode of the eleventh transistor M11 is connected to the pull down node PD.

In a noise reduction stage of the first shift register unit and the second shift register unit, the second clock signal written by the second clock signal terminal CLKB is a high level signal, the eleventh transistor M11 is turned on, and the node PD is pulled up to the high level, and charges the storage capacitor C3 at the same time.

Of course, the pull-down control sub-circuit 20 may also be connected to the first clock signal input terminal and the pull-down node PD for charging the pull-down node PD, namely charging he third storage capacitor C3, under control of the first clock signal inputted from the first clock signal input terminal, then the third storage capacitor C3 maintains the pull-down node PD at a high potential after the first shift register unit and the second shift register unit are reset, so that the first noise reduction sub-circuit 14 and the second noise reduction sub-circuit 24 can continuously reduce noise of signals output from the first pull-up node PU(N), the second pull-up node PU(N+1), the first signal output terminal Output(N), and the second signal output terminal Output (N+1).

For example, the pull-down control sub-circuit 20 may include an eleventh transistor M11; wherein the first electrode and the control electrode of the eleventh transistor M11 are both connected to the first clock signal terminal CLK, and the second electrode of the eleventh transistor M11 is connected to the Pull down node.

During a noise reduction stage of the first shift register unit and the second shift register unit, the first clock signal written by the first clock signal terminal CLK is a high level signal, the eleventh transistor M11 is turned on, and the pull down node PD is pulled up to a high level and the storage capacitor C3 is charged at same time.

The pull-down sub-circuit 30 is connected to the first pull-up node PU(N), the second pull-up node PU(N+1), the low-level signal terminal VGL and the pull-down node PD. It is configured to pull down the potential of the pull-down node PD by the low-level signal input by the low-level signal terminal VGL under control of the potentials of the first pull-up node PU(N) and the second pull-up node PU(N+1).

For example, the pull-down sub-circuit 30 may include a ninth transistor M9, a tenth transistor M10, and a twelfth transistor M12. The first electrode and the control electrode of the ninth transistor M9 are both connected to the first pull-up node PU(N). The second electrode of the ninth transistor M9 is connected to the control electrode of the twelfth transistor M12. The first electrode and the control electrode of the tenth transistor M10 are both connected to the second pull-up node PU(N+1), and the second electrode of the tenth transistor M10 is connected to the control electrode of the twelfth transistor M12. The first electrode of the twelfth transistor M12 is connected to the pull-down node PD, the second electrode of the twelfth transistor M12 is connected to the low-level signal terminal VGL, and the control electrode of the twelfth transistor M12 is connected to the second electrode of the ninth transistor M9 and the second electrode of the tenth transistor M10.

The turn-on and turn-off of the ninth transistor M9 and the tenth transistor M10 are controlled by the potentials of the first pull-up node PU(N) and the second pull-up node PU(N+1), respectively, and the twelfth transistor M12 is controlled by the potential of the first pull-up node PU(N) output by the ninth transistor M9 and the potential of the second pull-up node PU(N+1) output by the tenth transistor M10. Hence, as long as one of the potentials of the first pull-up node PU(N) and the second pull-up node PU(N+1) is a high level signal, the twelfth transistor M12 will be turned on, and at this time the potential of the pull-down node PD is pulled down by the low level signal input by the low level signal terminal VGL.

Figure 4:
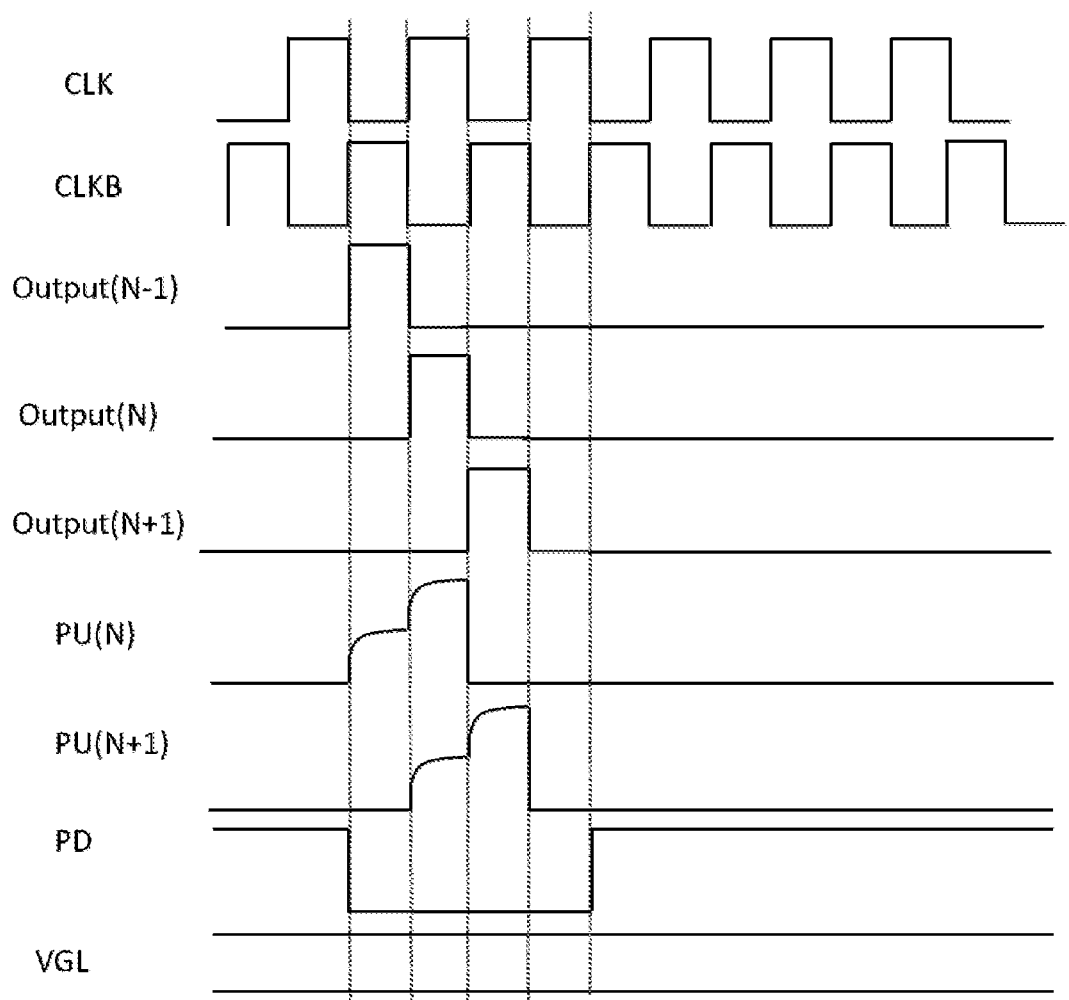
FIG. 4 is an operation timing diagram corresponding to the shift register of FIG. 1 according to embodiments of the present disclosure.

The operation principle of the shift register in some embodiments of the present disclosure will be described below with reference to FIGS. 1 and 4.

A first stage (the pre-charging stage of the first shift register unit): The first input signal written by the first input signal terminal Input(N) is a high level signal, the first transistor M1 is turned on, and the first input signal passes through the first transistor M1 to charge the first storage capacitor C1 so that the potential of the first pull-up node PU(N) is pulled high; since the first pull-up node PU(N) is at the high level at this time, the ninth transistor M9 and the twelfth transistor M12 are turned on, the storage capacitor C3 is discharged, and the potential of the pull-down node PD is pulled down to a low level; at this time, the potential of the pull-down node PD is at a low level, so the fourth transistor M4 and the fifteenth transistor M15 are turned off, and the first clock signal is low at the same time, thereby ensuring that the first signal output terminal Output(N) outputs a stable low-level signal.

A second stage (the output stage of the first shift register unit and the pre-charging stage of the second shift register unit): The first input signal written by the first input signal terminal Input(N) is a low level signal, the first transistor M1 is turned off, the first pull-up node PU(N) continues to maintain a high potential, and the third transistor M3 is kept in an on state. At this time, the first clock signal input by the first clock signal terminal CLK is a high-level signal, the first pull-up node PU(N) further pulls up the potential of the first pull-up node PU(N) due to a bootstrap effect of the first storage capacitor C1 to make the first signal output terminal Output(N) output a high level signal. Since the first pull-up node PU(N) is at a high potential, the ninth transistor M9 and the twelfth transistor M12 are in an on state, so the pull-down node PD is a low-level signal, the fourth transistor M4 and the fifteenth transistor M15 continues to be turned off, at the same time the second clock signal written by the second clock signal terminal CLKB is a low level signal, and the thirteenth transistor M13 is in an off state to ensure stability of signals output by the first signal output terminal Output(N).

In some embodiments, the high-level signal output by the first signal output terminal Output(N) in the first shift register unit may be used as the second input signal written by the second input signal terminal Input(N+1) in the second shift register unit in the shift register of the stage. At this time, the fifth transistor M5 is turned on, the second pull-up node PU(N+1) is pulled high, and the second storage capacitor C2 is charged at the same time. At this time, the second clock signal written by the second clock signal terminal CLKB is a low level signal, so the second signal output terminal Output(N+1) outputs a low level signal. At the same time, the second pull-up node PU(N+1) is pulled high so that the tenth transistor M10 and the twelfth transistor M12 are turned on, so the pull-down node PD is at a low level, and the eighth transistor M8 and the sixteenth transistor M16 are turned off to ensure that the second signal output terminal Output(N+1) outputs a stable low-level signal.

A third stage (the reset stage of the first shift register unit and the output stage of the second shift register unit): the reset signal written by the first reset signal terminal RESET (N) is at a high level and the second clock signal written by the second clock signal terminal CLKB is at a high level. At this time, the second transistor M2 and the fifteenth transistor M15 are turned on, and the first pull-up node PU(N) is pulled down to a low level, that is, resetting of the pull-down node PD is completed. The thirteenth transistor M13 is turned on, and the first signal output terminal Output(N) is pulled down to a low level, and resetting of the first signal output terminal Output(N) is completed at this time.

At the same time, since the signal output by the first signal output terminal Output(N) in the first shift register unit is used as an input of the second input signal terminal Input (N+1) in the second shift register unit, the fifth transistor M5 is turned off, and the second storage capacitor C2 is discharged. Due to the bootstrap effect of the second storage capacitor C2, the potential of the second pull-up node PU(N+1) is amplified, and the second clock signal is at a high level, the seven transistor M7 is turned on, so the second signal output terminal Output(N+1) outputs a high level signal. It should be noted here that since the second pull-up node PU(N+1) is at a high level at this time, the tenth transistor M10 and the twelfth transistor M12 are turned on, so the pull-down node PD is pulled low. Although the second clock signal is at a high level and the eleventh transistor M11 is turned on, but the pull-down node PD will not be pulled high. This is because the aspect ratio of the eleventh transistor M11 as selected is smaller than those of the tenth transistor M10 and the twelfth transistor M12.

It should be noted here that since the signal input by the first reset signal terminal RESET(N) is a high level signal at this stage, the signal output by the second signal output terminal Output(N+1) at this stage is just a high level signal, so the second signal output terminal Output(N+1) may provide a reset signal for the first reset signal terminal RESET(N).

The fourth stage (the reset stage of the second shift register unit): the reset signal written by the second reset signal terminal RESET(N+1) is a high level signal, the sixth transistor M6 is turned on, and the second pull-up node PU(N+1) is pulled down to a low level, that is, the reset of the second pull-up node PU(N+1) is completed; the first clock signal written by the first clock signal terminal CLK is also a high-level signal, the fourteenth transistor M14 is turned on, and the second signal output terminal Output(N+1) is pulled down to a low level, that is, the reset of the second signal output terminal Output(N+1) is completed.

The fifth stage (the noise reduction stage of the first shift register unit and the second shift register unit): the second clock signal written by the second clock signal terminal CLKB is a high level signal, the eleventh transistor M11 is turned on, the pull-down node PD is pulled up to the high level and the third storage capacitor C3 is charged at the same time. At this time, the fifteenth transistor M15 is turned on to reduce output noise of the first pull-up node PU(N). The fourth transistor M4 is turned on to reduce noise of the first signal output terminal Output(N). The sixth transistor M6 is turned on to reduce output noise of the second pull-up node PU(N+1). The eighth transistor M8 is turned on to reduce noise of the second signal output terminal Output (N+1). Of course, the thirteenth transistor M13 is controlled by the second clock signal and is also turned on at this time to stably reduce noise of the first signal output terminal Output(N). After that, although the second clock signal changes to a low level at a certain interval, a high potential of the pull-down node PD may be maintained by the third storage capacitor C3 so as to continue to perform pull-down noise reduction for the first pull-up node PU(N), the second pull-up node PU(N+1), the first signal output terminal Output(N), and the second signal output terminal Output (N+1). Wherein, when the second clock signal is at a low level, the first clock signal written by the first clock signal terminal CLK is a high level signal, and the fourteenth transistor M14 is turned on to stably reduce the noise of the second signal output terminal Output(N+1).

After that, repeat the fifth stage until an arrival of the next frame.

Figure 5:
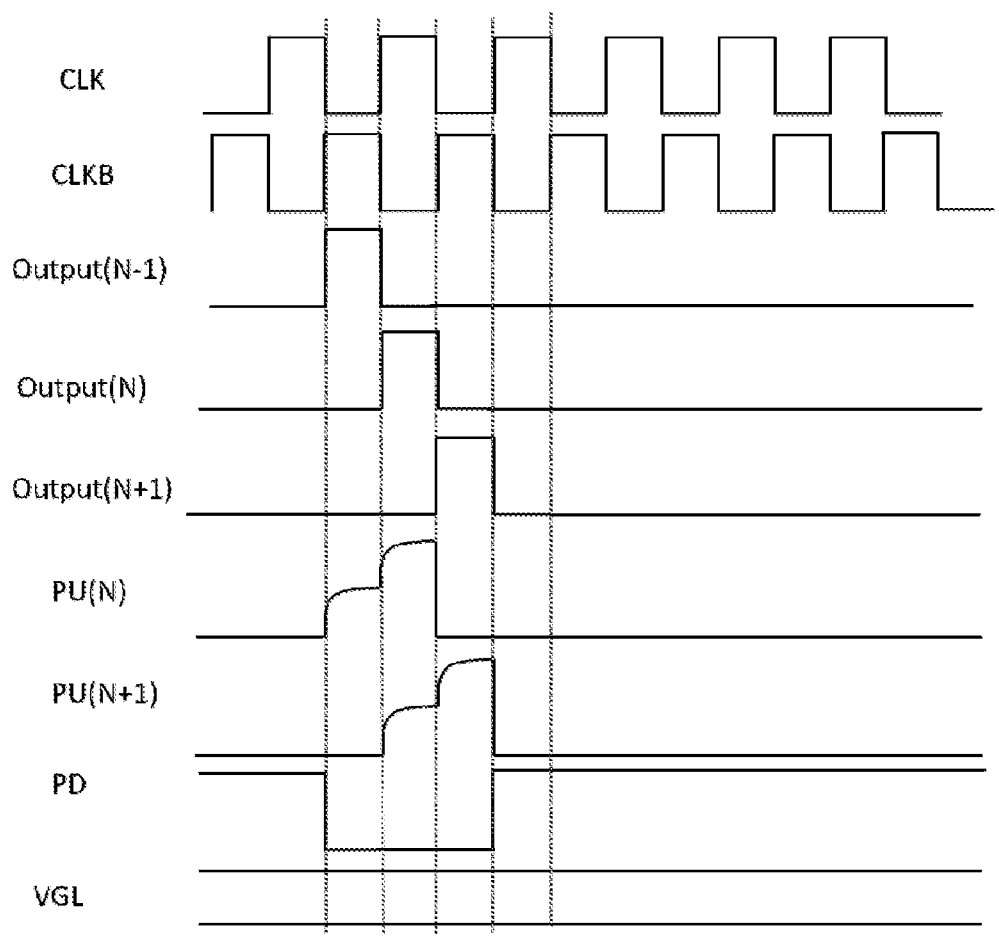
FIG. 5 is an operation timing diagram corresponding to the shift register of FIG. 3 according to embodiments of the present disclosure.

It should be noted here that when the first electrode and the control electrode of the eleventh transistor M11 of the pull-down control sub-circuit 20 in the shift register unit as used are both connected to the first clock signal terminal CLK and the second electrode of the first transistor 11 is connected to the pull-down node PD, the method of driving the shift register is similar to the above method except for the fourth stage (the reset stage of the second shift register unit) and the fifth stage (the noise reduction stage of the first shift register unit and the second shift register unit). As shown in FIG. 3 and FIG. 5, the fourth stage and the fifth stage may include:

The fourth stage (the reset stage of the second shift register unit): the reset signal written by the second reset signal terminal RESET(N+1) is a high level signal, the sixth transistor M6 is turned on, and the second pull-up node PU(N+1) is pulled down to a low level, that is, the reset of the second pull-up node PU(N+1) is completed. The first clock signal written by the first clock signal terminal CLK is also a high-level signal, the fourteenth transistor M14 is turned on, and the second signal output terminal Output(N+1) is pulled down to a low level, that is, the reset of the second signal output terminal Output(N+1) is completed. At the same time, since the first clock signal written by the first clock signal terminal CLK is a high level signal, the eleventh transistor M11 is also turned on, and at this time, the pull-down node PD is pulled up to a high level, and at the same time, the third storage capacitor C3 is charged.

The fifth stage (the noise reduction stage of the first shift register unit and the second shift register unit): Since the third storage capacitor C3 is charged at the fourth stage, the pull-down node PD can be maintained at a high potential by the third storage capacitor C3 at this time, the fifteenth transistor M15 is turned on to reduce output noise of the first pull-up node PU(N). The fourth transistor M4 is turned on to reduce noise of the first signal output terminal Output(N). The transistor M6 is turned on to reduce output noise of the second pull-up node PU(N+1). The eighth transistor M8 is turned on to reduce noise of the second signal output terminal Output(N+1). Of course, the thirteenth transistor M13 is controlled by the second clock signal and is also turned on at this time to stably reduce noise of the first signal output terminal Output(N). After that, although the first clock signal changes to a low level at a certain interval, the high potential of the pull-down node PD may be maintained by the third storage capacitor C3 so as to continuously perform pull-down noise reduction for the first pull-up node PU(N), the second pull-up node PU(N+1), the first signal output terminal Output(N), and the second signal output terminal Output(N+1). Wherein, when the first clock signal is at a low level, the first clock signal written by the first clock signal terminal CLK is a high level signal, and the fourteenth transistor M14 is turned on to stably reduce noise of the second signal output terminal Output(N+1).

Figure 6:
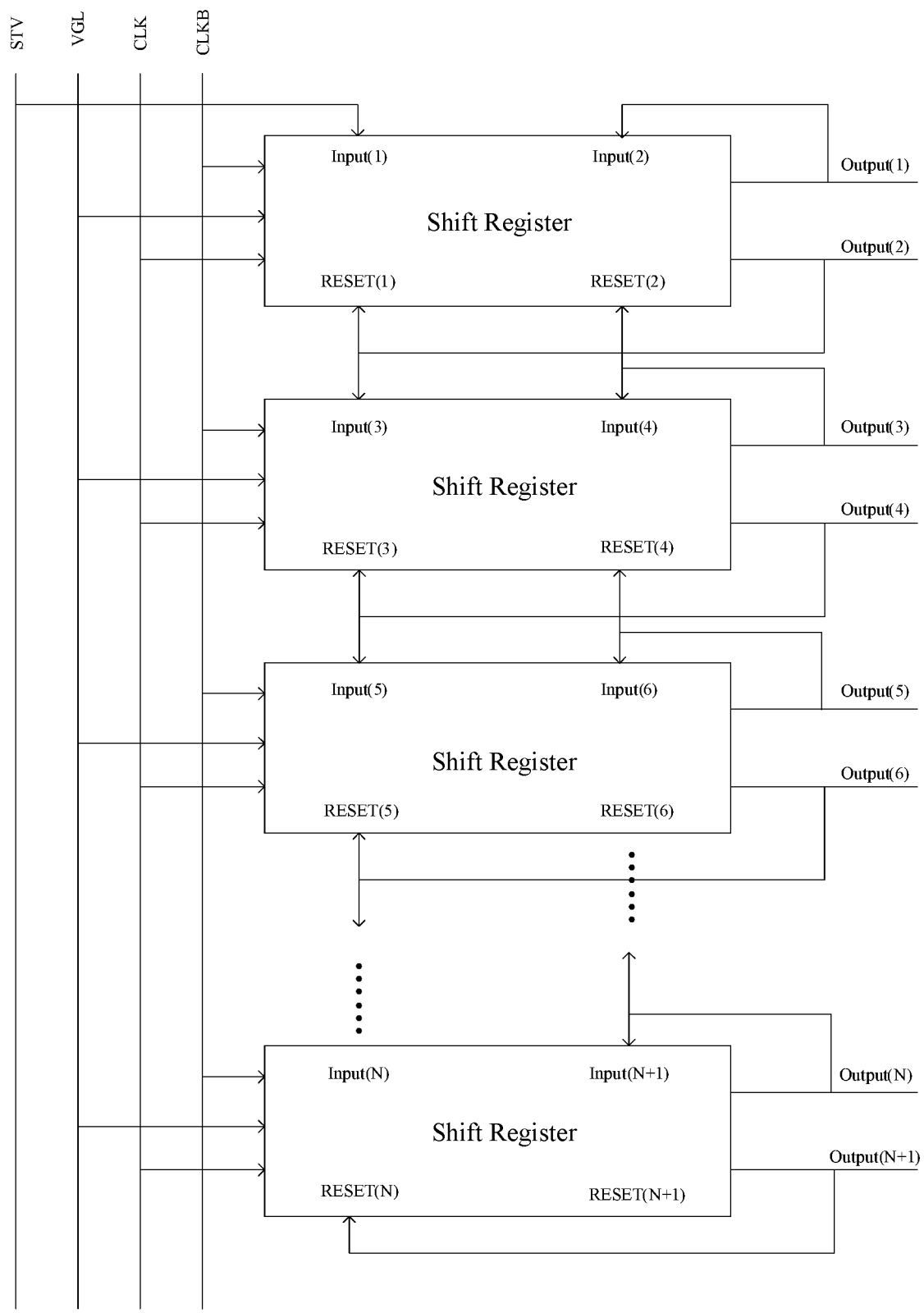
FIG. 6 is a cascade diagram of a gate driving circuit according to embodiments of the present disclosure.

As shown in FIG. 6, in some embodiments of the present disclosure, there is provided a gate driving circuit including shift registers in the above embodiments, wherein a first input signal terminal Input(N) of a first shift register unit in a shift register at each stage is connected to a second signal output terminal Output(N+1) of a second shift register unit in a shift register at a previous stage; a first reset signal terminal RESET(N) of the first shift register unit in the shift register in each stage is connected to a second signal output terminal Output(N+1) of a second shift register unit in the shift register at the current stage; a first signal output terminal Output(N) of the shift register unit of the shift register at each stage is connected to a second input signal terminal Input(N+1) of the second shift register unit in the shift register at the current stage; the second signal output terminal Output(N+1) of the second shift register unit of the shift register at each stage is connected to a first signal input terminal of a first shift register unit in a shift register at a next stage; a second reset signal terminal RESET(N+1) of the second shift register unit of the shift register at each stage is connected to a first signal output terminal of the first shift register unit in the shift register at the next stage.

Since the gate driving circuit in some embodiments of the present disclosure includes shift registers as described in the above embodiments, its power consumption is small and the cost is low.

Correspondingly, in some embodiments of the present disclosure, a display device is also disclosed that includes the above-described gate driving circuit. Due to the inclusion of the above-described gate driving circuit, it can realize a frame-narrowed design.

The display device may be any product or component having a display function such as a mobile phone, a tablet computer, a television, a monitor, a notebook computer, a digital photo frame, a navigator, and the like.

Of course, the display device in some embodiments of the present disclosure may also include other conventional structures such as a power supply unit, a display driving unit, and the like.

It can be understood that the above embodiments are for illustrating the principle of the present disclosure, but the present disclosure is not limited thereto. For a person of ordinary skill in the art, various variations and improvements may be made without departing from the spirit and essence of the present disclosure, and these variations and improvements are also considered to be within the protection scope of the present disclosure.

What is claimed is:

1. A shift register circuitry comprising: a first shift register unit, a second shift register unit, a pull-down control sub-circuit, and a pull-down sub-circuit; wherein the first shift register unit comprises: a first input sub-circuit, a first output sub-circuit, a first reset sub-circuit, and a first noise reduction sub-circuit; the second shift register unit includes: a second input sub-circuit, a second output sub-circuit, a second reset sub-circuit, and a second noise reduction sub-circuit;

wherein the first input sub-circuit is configured to pre-charge a first pull-up node under control of a first input signal; the first pull-up node is a connection node between the first input sub-circuit, the first output sub-circuit, the pull-down sub-circuit, the first reset sub-circuit, and the first noise reduction sub-circuit;

the first output sub-circuit is configured to output a first clock signal through a first signal output terminal under control of a potential of the first pull-up node;

the first reset sub-circuit is configured to reset potentials of the first pull-up node and the first signal output terminal through a first voltage signal under control of a first reset signal;

the second input sub-circuit is configured to pre-charge a second pull-up node under control of a second input signal; the second pull-up node is a connection node between the second input sub-circuit, the second output sub-circuit and the pull-down sub-circuit;

the second output sub-circuit is configured to output a second clock signal through a second signal output terminal under control of a potential of the second pull-up node;

the second reset sub-circuit is configured to reset potentials of the second pull-up node and the second signal output terminal through the first voltage signal under control of a second reset signal;

the pull-down control sub-circuit is configured to control a potential of a pull-down node under control of the first clock signal or the second clock signal; the pull-down node is a connection node between the pull-down control sub-circuit, the pull-down sub-circuit, the first noise reduction sub-circuit and the second noise reduction sub-circuit;

the pull-down sub-circuit is configured to pull down a potential of the pull-down node through the first voltage signal under control of a potential of the first pull-up node and a potential of the second pull-up node;

the first noise reduction sub-circuit is configured to reduce output noise of the first pull-up node and the first signal output terminal through the first voltage signal under control of the pull-down node; and the second noise reduction sub-circuit is configured to reduce output noise of the second pull-up node and the second signal output terminal through the first voltage signal under control of the pull-down node, wherein the pull-down sub-circuit comprises a ninth transistor, a tenth transistor, and a twelfth transistor, wherein a first electrode and a control electrode of the ninth transistor are both connected to the first pull-up node and a second electrode of the ninth transistor is connected to a control electrode of the twelfth transistor;

a first electrode and a control electrode of the tenth transistor are both connected to the second pull-up node, and a second electrode of the tenth transistor is connected to the control electrode of the twelfth transistor, and a first electrode of the twelfth transistor is connected to the pull-down node, a second electrode of the twelfth transistor is connected to a first voltage signal terminal, and the control electrode of the twelfth transistor is connected to the second electrode of a first transistor and the second electrode of the tenth transistor.

2. The shift register circuitry according to claim 1, further comprising a storage sub-circuit configured to maintain the potential of the pull-down node.

3. The shift register circuitry according to claim 1, wherein the first input sub-circuit includes a first transistor;
wherein a first electrode and a control electrode of the first transistor are both connected to a first input signal terminal, and a second electrode of the first transistor is connected to the first pull-up node.

4. The shift register circuitry according to claim 1, wherein the first output sub-circuit includes a third transistor and a first storage capacitor;
wherein a first electrode of the third transistor is connected to a first clock signal terminal, a second electrode of the third transistor is connected to a first signal output terminal, and a control electrode of the third transistor is connected to the first pull-up node; and
a first end of the first storage capacitor is connected to the first pull-up node, and a second end of the first storage capacitor is connected to the first signal output terminal.

5. The shift register circuitry according to claim 1, wherein the first reset sub-circuit comprises: a second transistor and a thirteenth transistor;
wherein a first electrode of the second transistor is connected to the first pull-up node, a second electrode of the second transistor is connected to a first voltage signal terminal, and a control electrode of the second transistor is connected to a first reset signal terminal; and
a first electrode of the thirteenth transistor is connected to the first signal output terminal, a second electrode of the thirteenth transistor is connected to the first voltage signal terminal, and a control electrode of the thirteenth transistor is connected to a second clock signal terminal.

6. The shift register circuitry according to claim 1, wherein the first reset sub-circuit comprises: a second transistor and a thirteenth transistor;
wherein a first electrode of the second transistor is connected to the first pull-up node, a second electrode of the second transistor is connected to a first voltage signal terminal, and a control electrode is connected to a first reset signal terminal; and
a first electrode of the thirteenth transistor is connected to the first signal output terminal, a second electrode of the thirteenth transistor is connected to a first voltage signal terminal, and a control electrode of the thirteenth transistor is connected to the first reset signal terminal.

7. The shift register circuitry according to claim 1, wherein the first noise reduction sub-circuit comprises a fourth transistor and a fifteenth transistor;
wherein a first electrode of the fourth transistor is connected to the first signal output terminal, a second electrode of the fourth transistor is connected to a first voltage signal terminal, and a control electrode of the fourth transistor is connected to the pull-down node; and
a first electrode of the fifteenth transistor is connected to the first pull-up node, a second electrode of the fifteenth transistor is connected to a first voltage signal terminal, and a control electrode of the fifteenth transistor is connected to the pull-down node.

8. The shift register circuitry according to claim 1, wherein the second input sub-circuit comprises a fifth transistor;
wherein a first electrode and a control electrode of e fifth transistor are both connected to a second input signal terminal, and a second electrode of the fifth transistor is connected to the second pull-up node.

9. The shift register circuitry according to claim 1, wherein the second output sub-circuit includes a seventh transistor and a second storage capacitor;
wherein a first electrode of the seventh transistor is connected to a second clock signal terminal, a second electrode of the seventh transistor is connected to the second signal output terminal, and a control electrode of the seventh transistor is connected to the second pull-up node; and
a first end of the second storage capacitor is connected to the second pull-up node, and a second end of the second storage capacitor is connected to the second signal output terminal.

10. The shift register circuitry according to claim 1, wherein the second reset sub-circuit comprises a sixth transistor and a fourteenth transistor;
wherein a first electrode of the sixth transistor is connected to the second pull-up node, a second electrode of the sixth transistor is connected to a first voltage signal terminal, and a control electrode of the sixth transistor is connected to a second reset signal terminal; and
a first electrode of the fourteenth transistor is connected to the second signal output terminal; a second electrode of the fourteenth transistor is connected to the first voltage signal terminal, and a control electrode of the fourteenth transistor is connected to a first clock signal terminal.

11. The shift register circuitry according to claim 1, wherein the second reset sub-circuit comprises a sixth transistor and a fourteenth transistor;
  wherein a first electrode of the sixth transistor is connected to the second pull-up node, a second electrode of the sixth transistor is connected to a first voltage signal terminal, and a control electrode of the sixth transistor is connected to a second reset signal terminal; and
  a first electrode of the fourteenth transistor is connected to the second signal output terminal, a second electrode of the fourteenth transistor is connected to the first voltage signal terminal, and a control electrode of the fourteenth transistor is connected to a second reset signal terminal.

12. The shift register circuitry according to claim 1, wherein the second noise reduction sub-circuit comprises an eighth transistor and a sixteenth transistor;
  wherein a first electrode of the eighth transistor is connected to the second signal output terminal, a second electrode of the eighth transistor is connected to a first voltage signal terminal, and a control electrode of the eighth transistor is connected to the pull-down node; and
  a first electrode of the sixteenth transistor is connected to the second pull-up node, a second electrode of the sixteenth transistor is connected to a first voltage signal terminal, and a control electrode of the sixteenth transistor is connected to the pull-down node.

13. The shift register circuitry according to claim 1, wherein the pull-down control sub-circuit comprises an eleventh transistor;
  wherein a first electrode and a control electrode of the eleventh transistor are both connected to a second clock signal terminal, and a second electrode of the eleventh transistor is connected to the pull-down node.

14. The shift register circuitry according to claim 1, wherein the pull-down control sub-circuit comprises an eleventh transistor;
  wherein a first electrode and a control electrode of the eleventh transistor are both connected to a first clock signal terminal, and a second electrode of the eleventh transistor is connected to the pull-down node.

15. The shift register circuitry of claim 2, wherein the storage sub-circuit includes a third storage capacitor;
  wherein a first end of the third storage capacitor is connected to the pull-down node, and a second end of the third storage capacitor is connected to the first voltage signal terminal.

16. A gate driving circuit comprising shift register circuitries of claim 1.

17. The gate driving circuit of claim 16, wherein a first input signal terminal of a first shift register unit of a shift register circuitry at each stage is connected to a second signal output terminal of a second shift register unit of a shift register circuitry at a previous stage;
  a first reset signal terminal of the first shift register unit of the shift register circuitry at each stage is connected to a second signal output terminal of a second shift register unit of the shift register circuitry at current stage;
  a first signal output terminal of the first shift register unit of the shift register circuitry at each stage is connected to a second signal input terminal of the second shift register unit of the shift register circuitry at current stage;
  a second signal output terminal of the second shift register unit of the shift register circuitry at each stage is connected to a first signal input terminal of a first shift register unit of a shift register circuitry at a next stage; and
  a second reset signal terminal of the second shift register unit of the shift register circuitry at each stage is connected to a first signal output terminal of the first shift register unit of the shift register circuitry at the next stage.

18. A display device comprising the gate driving circuit of claim 16.

19. The display device according to claim 18, wherein a first input signal terminal of a first shift register unit of a shift register circuitry at each stage is connected to a second signal output terminal of a second shift register unit of a shift register circuitry at a previous stage;
  a first reset signal terminal of the first shift register unit of the shift register circuitry at each stage is connected to a second signal output terminal of a second shift register unit of the shift register circuitry at current stage;
  a first signal output terminal of the first shift register unit of the shift register circuitry at each stage is connected to a second signal input terminal of the second shift register unit of the shift register circuitry at current stage;
  a second signal output terminal of the second shift register unit of the shift register circuitry at each stage is connected to a first signal input terminal of a first shift register unit of a shift register circuitry at a next stage; and
  a second reset signal terminal of the second shift register unit of the shift register circuitry at each stage is connected to a first signal output terminal of the first shift register unit of the shift register circuitry at the next stage.

* * * * *